United States Patent
Jain

(10) Patent No.: US 8,467,424 B2
(45) Date of Patent: Jun. 18, 2013

(54) PULSED LASER SOURCE WITH HIGH REPETITION RATE

(75) Inventor: Kanti Jain, Hawthorne, NY (US)

(73) Assignee: Anvik Corporation, Hawthorne, NY (US)

( * ) Notice: Subject to any disclaimer, the term of this patent is extended or adjusted under 35 U.S.C. 154(b) by 119 days.

(21) Appl. No.: 13/135,290

(22) Filed: Jun. 30, 2011

(65) Prior Publication Data

US 2013/0003032 A1 Jan. 3, 2013

(51) Int. Cl.
*H01S 3/10* (2006.01)

(52) U.S. Cl.
USPC .................. 372/25; 372/29.014; 372/29.015; 372/29.02; 372/30

(58) Field of Classification Search
USPC ....................... 372/25, 29.014, 29.012, 29.02
See application file for complete search history.

(56) References Cited

U.S. PATENT DOCUMENTS

| 7,590,155 | B2 | 9/2009 | Liu | |
| 2004/0202219 | A1* | 10/2004 | Govorkov et al. | 372/55 |
| 2009/0245301 | A1* | 10/2009 | Peng et al. | 372/25 |
| 2011/0122387 | A1* | 5/2011 | Tao et al. | 355/67 |

* cited by examiner

*Primary Examiner* — Dung Nguyen
(74) *Attorney, Agent, or Firm* — Lathrop & Gage LLP

(57) ABSTRACT

Methods and systems for generating pulses of laser radiation at higher repetition rates than those of available excimer lasers are disclosed that use multiple electronic triggers for multiple laser units and arrange the timings of the different triggers with successive delays, each delay being a fraction of the interval between two successive pulses of a single laser unit. Methods and systems for exposing nanoscale patterns using such high-repetition-rate lasers are disclosed.

18 Claims, 10 Drawing Sheets

PULSED LASER SOURCE WITH HIGH REPETITION RATE

BACKGROUND OF THE INVENTION

1. Field of the Invention

This invention relates to pulsed laser source systems, and particularly relates to methods and apparatus for ultraviolet, pulsed, excimer laser source systems with high repetition rates. Such laser systems are useful as light sources in nano-lithography systems for production of electronic devices.

2. Description of Related Art

The manufacture of modern electronic devices, commonly referred to as integrated circuits (ICs) or chips, requires a number of fabrication technologies. One of the most critical of such fabrication technologies is lithography, the process of patterning the billions of structures that form the individual components of the devices on the semiconductor wafers. Advances in the manufacture of electronic devices have required the patterning of ever smaller structures on the wafers, which, for the process of lithography, is referred to as requiring higher (i.e., finer) patterning resolution.

A key element in a lithography system that enables it to achieve a fine patterning resolution is its light source, which in modern lithography systems is an ultraviolet excimer laser due to its short wavelength. Typically, modern lithography systems use an Argon Fluoride (ArF) excimer laser source that emits radiation of 193 nanometer (nm) wavelength. Due to the fundamental physical operating mechanism of such a laser, it operates only as a pulsed source, with a typical pulse repetition rate of a few hundred to a few thousand pulses per second.

A modern lithography system with an excimer laser source also comprises a high-resolution, large-field projection lens that creates an image of a master pattern present on a mask onto the semiconductor wafer. The overall performance of the lithography system is determined by the projection lens, the light source, the mask, and several other factors. Current state-of-the-art lithography systems are capable of producing device structures in high volumes with a minimum feature size in the vicinity of 22-45 nm. With such small feature sizes, electronic chips with several billion transistors can be produced.

The demands on electronic systems to operate at ever greater speeds and have ever greater storage capacities are requiring more advanced chips with minimum feature sizes smaller than 22 nm. Modern lithography systems are incapable of patterning electronic structures with such small features with sufficiently high production throughputs for required cost efficiencies. There is thus a need to develop advanced lithography systems that can provide a patterning resolution significantly finer than 22 nm and patterning throughput of, for example, 100 or more wafers per hour. Such lithography systems are currently not available. To meet these objectives, many new lithography approaches are being investigated in the semiconductor industry and at research institutions, including extreme ultraviolet lithography, maskless lithography, immersion lithography, and other.

Of these new approaches, maskless lithography holds particularly strong promise due to its many advantages, including high resolution and elimination of the mask as a requirement in the lithography process. (That the latter is significant can be recognized by noting that the cost of the mask set for patterning the layers of a modern chip exceeds five million dollars.) Examples of methods and apparatus for maskless lithography are disclosed in U.S. Pat. No. 6,312,134, Seamless, Maskless Lithography System Using Spatial Light Modulator, 2001; U.S. Pat. No. 6,707,534, Maskless Conformable Lithography, 2004; U.S. Pat. No. 6,870,554, Maskless Lithography with Multiplexed Spatial Light Modulators, 2005; and U.S. Pat. No. 7,164,465, Maskless Lithography with Sub-Pixel Resolution, 2004.

In a maskless lithography system, the conventional hard mask as used in a typical optical projection lithography system is replaced by a spatial light modulator (SLM) array. Each element (i.e., individual element) in the SLM array can be programmed to be "On" or "Off", i.e., reflective or nonreflective for a reflective-type SLM (or transmissive or non-transmissive for a transmissive-type SLM), so that the collection of all the beams emerging from an SLM array can be programmed to represent any desired pattern of light pixels that can then expose a photosensitive medium to create the corresponding pattern therein.

State-of-the-art SLMs have modulator elements of size in the vicinity of 10 micrometer×10 micrometer. In a maskless lithography system, by using a projection lens with a reduction ratio of approximately 200:1, an image pixel size of (10 micrometer)/(200)=50 nm can be produced. Thus, in order to improve the resolution of a maskless lithography system, the modulator element size must be reduced or the projection lens reduction ratio must be increased, both of which avenues are difficult.

It will therefore be beneficial to devise a technique that provides higher resolution for a maskless lithography system than the minimum feature size ("pixel size") printed on the basis of the SLM element size and the projection lens reduction ratio.

Methods and apparatus for maskless lithography for providing a resolution finer than a pixel size, i.e., sub-pixel resolution, have been developed and are disclosed in U.S. Pat. No. 6,717,650, Maskless Lithography with Sub-Pixel Resolution, 2004, and U.S. Pat. No. 7,170,669, Spatial Modulator with Minimized Heat Absorption and Enhanced Resolution Features, 2007. These methods and apparatus define sub-pixel-size features by partial overlap between pixel-size features, exploit nonlinear photoresponse characteristics of the imaging media, and effectively use massively parallel bit addressing for full-pattern definition and high throughput.

In addition to the above considerations, the performance achievable by maskless lithography systems is dependent not only upon the ability of the SLM to rapidly transfer the pattern information from the data file to the imaging medium, but also upon the ability of the light source to illuminate the SLM with a new pulse every time the SLM frame (i.e., the array of all the modulator elements) is refreshed (i.e., provided a new set of pattern data). Modern SLMs can have frame refresh rates as high as 25 kHz, i.e., all the modulator elements can be provided with new "On" or "Off" information 25,000 times per second. In order to utilize such a high frame refresh rate capability, the light source must also be able to provide the same number of pulses per second. Modern excimer laser light sources are available with pulse repetition rates that are limited to approximately 6 kHz. Available light sources are therefore inadequate for implementation in maskless lithography systems with the highest refresh rate SLM arrays.

Therefore, there is a need to develop an ultraviolet excimer laser light source capable of providing pulses at repetition rates in the vicinity of 25 kHz and preferably even higher.

It is an object of this invention to provide a method for producing pulsed ultraviolet laser radiation at high repetition rates.

It is another object of this invention to provide an apparatus for producing pulsed ultraviolet excimer laser radiation with repetition rates of tens of thousands of pulses per second.

It is yet another object of this invention to provide a high-resolution maskless lithography method and apparatus utilizing a high-repetition-rate laser light source for illuminating a spatial light modulator array.

With the above examples of objects, other objects of this invention will be evident to those skilled in the art of semiconductor manufacturing, lithography, and related fields.

An advantage of the invention is that it enables effective utilization of high-refresh-rate spatial light modulators in maskless lithography systems for achieving high throughputs and high resolutions.

Another advantage of the invention is that it provides the ability to produce high-repetition-rate laser pulses using lower-repetition-rate laser sources.

Yet another advantage of this invention is that it enables the optimization of the combined operation of the illumination source and the spatial light modulator array in a maskless lithography system to achieve optimum throughput and resolution.

With the above examples of the advantages, other advantages of this invention will be evident to those skilled in the art of semiconductor manufacturing, lithography, and related fields.

LIST OF DRAWINGS

FIG. 1 illustrates the basic concept of the invention, showing multiple excimer laser units, each unit having a master-oscillator sub-unit and a power-amplifier sub-unit, each laser unit triggered by well defined pulse triggers, such that specified delays introduced between the trigger pulses produce a final laser pulse train that has a substantially higher effective repetition rate than possible with a single laser unit.

SUMMARY OF THE INVENTION

Figure 1:
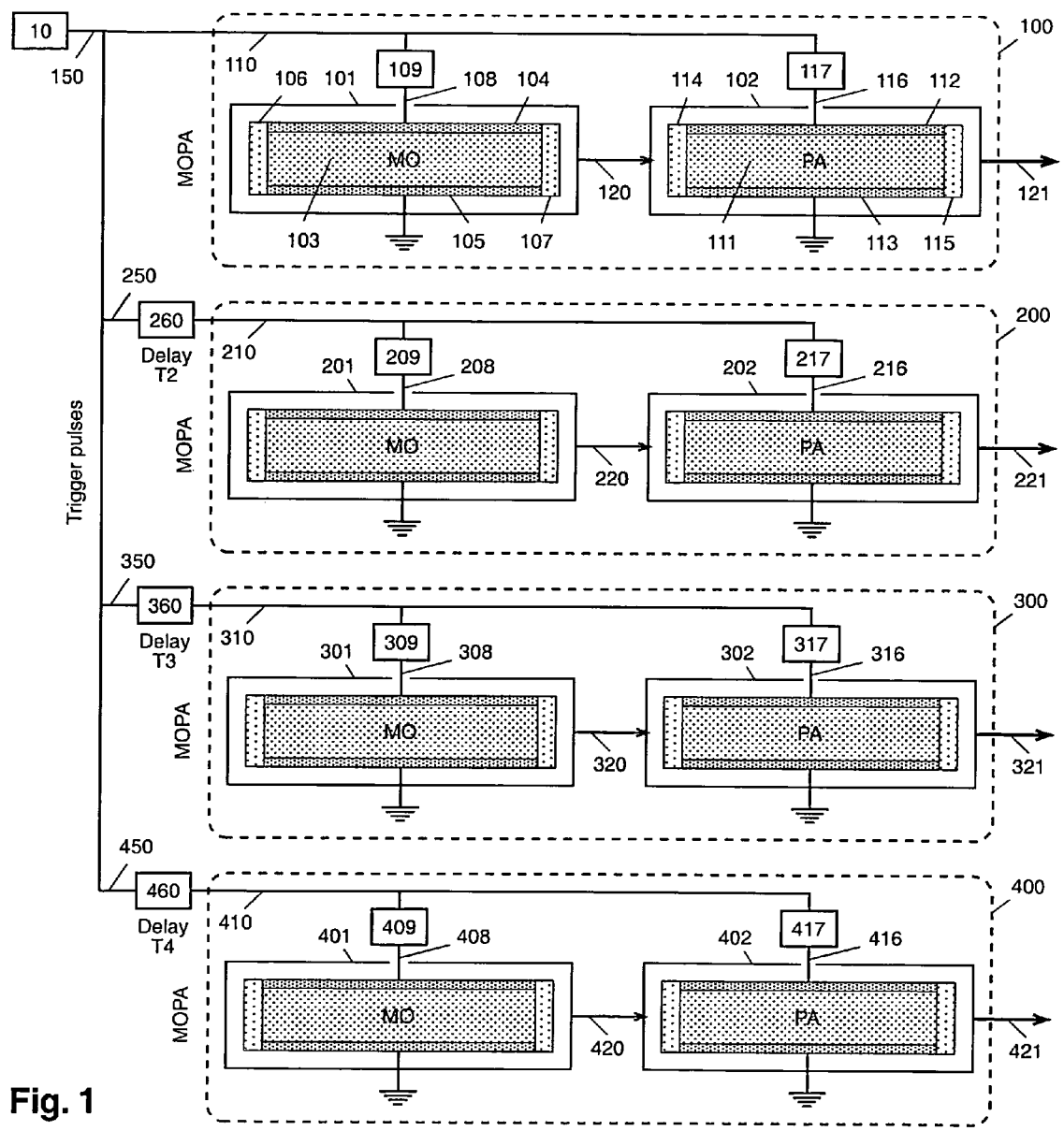

In this invention, it is disclosed how an excimer laser source system can be constructed that has a higher pulse repetition rate than that of available excimer lasers. The fundamental concept of the invention, illustrated in FIG. 1, is to use multiple electronic triggers for multiple excimer laser units and arrange the timings of the different triggers with successive delays, each delay being a fraction of the interval between two successive pulses of a single laser unit.

Figure 2:
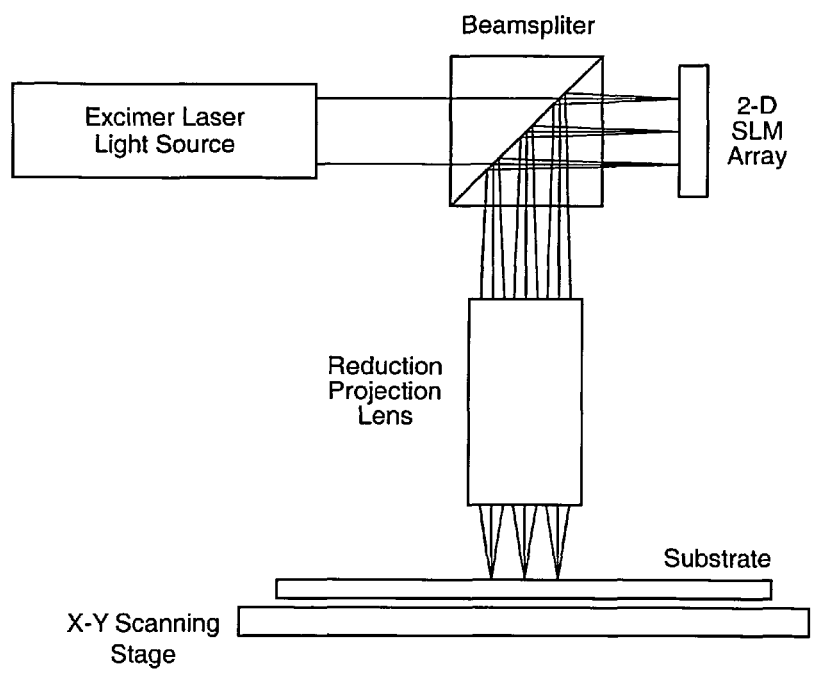
FIG. 2 shows the basic concept of maskless lithography and identifies the key components of such a lithography system, including a light source, a spatial light modulator array, a projection lens, and a scanning stage.
Figure 3:
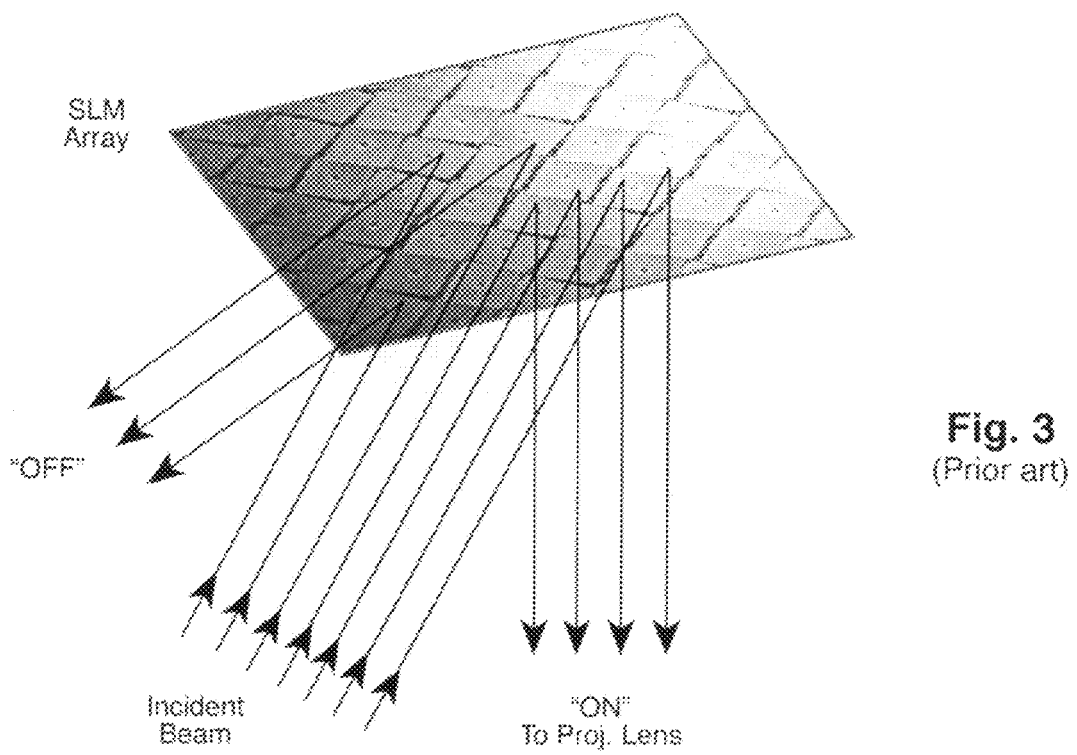
FIG. 3 illustrates the operation of a spatial light modulator array, showing how individual modulators can be turned on or off as required for exposure of the desired pattern directly on the semiconductor wafer.

The basic concept of maskless lithography is well known (prior art). Conceptually, a representative optical maskless lithography system (FIG. 2) uses an ultraviolet laser beam, e.g., from an excimer laser, to illuminate a spatial light modulator, e.g., a digital micromirror device (DMD), which is a 2-D array of micromodulators. Acting as reflectors, these hundreds of thousands (or millions) of modulators direct a desired set of beamlets into a high-reduction-ratio projection lens, which images the modulators on a photoresist-coated wafer, which can be stepped or scanned. In brief, the key features and attributes of such a maskless lithography are the following: (i) The conventional hard mask used in optical projection exposure tools is replaced by a spatial light modulator (SLM). (ii) The SLM is a 2-D array of reflective or transmissive light modulators which can independently control $10^6$ or even $>10^7$ light beams. (iii) A desired set of beamlets reflected from the SLM (or transmitted beamlets if it is a transmissive SLM) are directed into a projection lens (FIG. 3). These "On" beams correspond to locations where exposure in the resist is desired. The other ("Off") beams are not captured by the projection lens.

Currently, the most advanced types of SLMs are the digital micromirror device (DMD) chips, among which a leading device has approximately two million modulator elements and a "frame refresh rate" of approximately 23 kHz, which is the rate at which the DMD chip frame, i.e., all the mirror elements, can be sent new bit information. In order to achieve as high a wafer exposure rate as possible, the lithography system must utilize the maximum frame refresh, which requires that the light source be able to illuminate the SLM with at least one new pulse for each frame. Thus, the illumination source, i.e., the ultraviolet laser, must be able to emit pulses at the rate of at least 23 kHz. Often, it is desirable that each SLM frame be illuminated by two or more pulses to achieve more precise exposure control. In such a case, the illumination source must be able to provide pulses at a rate that is a multiple of the SLM frame refresh rate.

The most desirable light source for high-resolution lithography is an ultraviolet excimer laser due to its short wavelength, high power, and other favorable characteristics. For example, many modern lithography systems for commercial production of semiconductor devices use an Argon Fluoride (ArF) excimer laser emitting pulsed radiation at a wavelength of 193 nm. It will be therefore desirable also to develop a maskless lithography system that can use an ArF excimer laser as the light source. In the ArF excimer laser active medium which contains a mixture of fluorine, argon and a buffer gas, the laser photon is emitted when an electron falls from an excited metastable state of the rare gas halide (ArF) to an unstable state of that halide. Due to the nature of this fundamental operating mechanism of an excimer laser, it can emit laser radiation only in a pulsed manner. The highest rate at which laser pulses can be emitted by modern excimer lasers is limited to a few thousand pulses per second, with a maximum rate of approximately 3-6 kHz. Since modern SLMs can have frame refresh rates of several times that value, it is desirable to develop methods that can significantly increase the pulse repetition rates of excimer lasers, as described in this invention.

Figure 4:
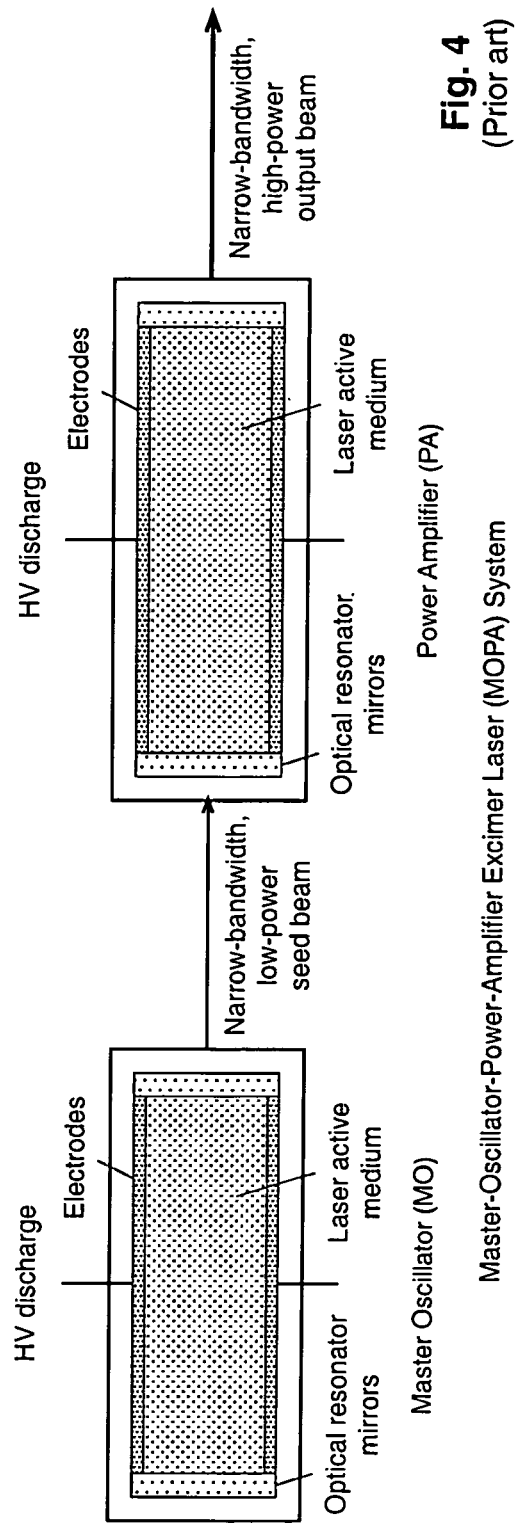
FIG. 4 shows a representative excimer laser system configuration called "master-oscillator-power-amplifier" (MOPA) that comprises two sub-units, called a master oscillator (MO) and power amplifier (PA).

A typical laser comprises an optical resonator with two mirrors between which the active medium is contained and between which the light rays bounce back and forth, enabling the laser beam to build up by stimulated emission of radiation. A representative excimer laser system, due to high gain in its active lasing medium, can be constructed with an optical resonator that has only one mirror, the other mirror being replaced by transmitting window. While such a configuration provides high laser power output, it may also broaden the frequency bandwidth of the laser radiation, which is sometimes not desirable. In order to produce a laser beam with better spectral characteristics, an alternate configuration for excimer laser systems comprises two sub-units, each being essentially a separate excimer laser, called a master oscillator (MO) and a power amplifier (PA), as shown in FIG. 4. In such a configuration, called master-oscillator-power-amplifier (MOPA), the MO unit has an optical resonator with two mirrors and produces a laser beam with a very narrow spectral bandwidth, typically less than 0.5 picometer, and low pulse energy. The beam from the MO is then used to "seed" a PA unit, which has no resonator mirrors (both mirrors being replaced by transmitting windows) and whose function is to amplify the beam from the MO while maintaining its spectral characteristics. The resulting laser beam emerging from the MOPA therefore has both the narrow bandwidth produced by the MO and the high pulse energy produced by the PA. However, as explained in the preceding paragraph, it does not have the desired high pulse repetition rate needed to utilize the high frame refresh rates of modern SLMs.

In this invention, an excimer laser source system is disclosed that has a higher pulse repetition rate than that of available excimer lasers. In its key concept, the invention uses multiple electronic triggers for multiple excimer laser units and arranges the arrival times of the different triggers with successive delays such that each delay is a fraction of the interval between two successive pulses of a single laser unit. For example, consider an excimer laser with a pulse repetition rate of 2 kHz. The interval between two successive pulses from such a laser is 500 microseconds. If now one uses five lasers and triggers them by pulses that are successively delayed by 100 microseconds, then the five lasers taken together will produce 10,000 laser pulses per second that are emitted at intervals of 100 microseconds, i.e., effectively, providing an excimer laser source with a pulse repetition rate of 10 kHz.

In the excimer laser active medium, a high-voltage electric discharge is produced by a high-voltage pulse generator, such as a thyratron, that is triggered by low-voltage pulses from a conventional electronic pulse generator. In this invention, such a pulse generator serves as a master pulse generator. Using the above example, each pulse from the generator is split into five pulses. Of these, pulse no. 1 triggers a MOPA unit directly; pulse no. 2 passes through an electronic delay unit that delays its arrival by 100 microseconds and triggers the discharge of a MOPA system no. 2; pulse no. 3 passes through an electronic delay unit that delays its arrival by 200 microseconds and triggers the discharge of a MOPA system no. 3; and so on, until pulse no. 5 which passes through an electronic delay unit that delays its arrival by 400 microseconds and triggers the discharge of a MOPA system no. 5. The pulses emerging from the five MOPA units, considered together, then effectively provide a train of excimer laser pulses arriving every 100 microseconds, i.e., at the rate of 10 kHz. As will be immediately clear, this configuration can be varied in many different ways to provide an excimer laser source system with many different desirable pulse repetition schemes.

DETAILED DESCRIPTION OF THE INVENTION

An embodiment of the invention is shown in FIG. 1. The system illustrated in FIG. 1 is an Argon Fluoride excimer laser system that produces laser pulses of 193 nm wavelength at a high repetition rate, for example, 25 kHz. The system can similarly be a KrF or other excimer laser. It comprises multiple sets (for example, four) of master-oscillator-power-amplifier (MOPA) units (100, 200, 300, 400). Each MOPA unit (prior art) comprises a master-oscillator (MO) sub-unit and a power-amplifier (PA) sub-unit. For example, MOPA 1, denoted as 100, comprises an MO 101 and a PA 102. Similarly, MOPA 2 (200) comprises an MO 201 and a PA 202, etc. Each of the MOs is an excimer laser having an optical resonator. For example, MO 101 is an excimer laser comprising active lasing medium 103, electrodes 104 and 105, and resonator mirrors 106 and 107.

Each MO produces an excimer laser "seed" beam with narrow spectral bandwidth and low pulse energy. For example, MO 101 produces an excimer laser seed beam 120 with a spectral bandwidth of a fraction of a picometer (pm) and a pulse energy of a few microjoules (µJ). The resonator mirror 106 is a high-reflectivity mirror with a flat or concave surface. The mirror 107 has a lower reflectivity than that of mirror 106, and may have a flat or concave surface. The active medium 103 is a mixture of various gases, such as argon, fluorine, and a buffer gas, such as helium. The electrodes 104 and 105 produce a high-voltage electric discharge in the active lasing medium 103. The electrode 104 receives a high-voltage pulse 108 from a high-voltage pulse generator 109. Electrode 105 is typically grounded. Pulse 108 may be, for example, a 30 kilovolt (kV) pulse and may have a pulsewidth on the order of a microsecond (µs). The high-voltage pulse generator 109 comprises, for example, a thyratron, and is triggered by a trigger 110 from a typical low-voltage electronic pulse generator 10. The pulse rate provided by the pulse generator 10 may be, for example, 6.25 kHz, which then will also be the repetition rate at which laser pulses are emitted by MO 101 as seed beam 120.

The power amplifier 102 comprises active lasing medium 111, electrodes 112 and 113, and transmissive windows 114 and 115 which have flat surfaces. The active medium 111 is a mixture of various gases, such as argon, fluorine, and a buffer gas, such as helium. The electrodes 112 and 113 produce a high-voltage electric discharge in the active lasing medium 111. The electrode 112 receives a high-voltage pulse 116 from a high-voltage pulse generator 117. Electrode 113 is typically grounded. Pulse 116 may be, for example, a 30 kV pulse and may have a pulsewidth on the order of a µs. The high-voltage pulse generator 117 comprises, for example, a thyratron, and is triggered by a trigger 110 from a typical low-voltage electronic pulse generator 10 in synchronism with the triggering of the pulse generator 109. The excimer laser seed beam 120 emitted by MO 101 is amplified by PA 102, resulting in the final laser output beam from MOPA 100, denoted as beam 121. The spectral bandwidth of beam 121 is substantially the same as the spectral bandwidth of beam 120 and may be, for example, a fraction of a picometer. The energy of each pulse in beam 121 is significantly greater than the energy of each pulse in beam 120 and may be, for example, a few millijoules (mJ).

In an alternate configuration, the master oscillator (MO 101) may be an ultraviolet laser source other than an excimer laser. For example, a pulsed rare gas ion laser, or a pulsed tunable dye laser, or a pulsed tunable solid-state laser may be frequency-multiplied in a nonlinear optical medium to generate narrow-bandwidth ultraviolet laser radiation at the same wavelength as an excimer laser and may thus serve as the seed laser for the power amplifier (PA 102) which is an excimer laser.

MOPA 200 is nearly identical (but not entirely) to MOPA 100 and comprises MO 201 and PA 202 which are triggered by, respectively, pulses 208 and 216 from high-voltage pulse generators 209 and 217, both of which in turn are triggered synchronously by pulse 210. The difference between MOPA 100 and MOPA 200 is that the low-voltage trigger pulse 210 is not synchronous with trigger pulse 110. Rather, trigger pulse 210 is delayed after 110 by a certain delay interval T2. The pulse 210 is produced by splitting the output signal 150 from the low-voltage pulse generator 10 into as many signals as there are MOPA units. For the example of FIG. 1, the output signal 150 is split into four signals, 110, 250, 350, and 450. As already described in the preceding paragraphs, the signal 110 triggers the high-voltage pulse generators 109 and 117 of MOPA 100. The signal 250 goes through an electronic delay unit 260 which produces the pulse 210 that is delayed after pulse 110 by a time interval T2. Since pulse T2 triggers the high-voltage pulse generators 209 and 217, pulses in the output beam 221 of MOPA 200 are delayed from pulses in the output beam 121 of MOPA 100 by the same time interval T2. We remark that electronic delay units such as 260, 360, and 460 are readily available as electronic instruments that are commonly used.

Figure 5:
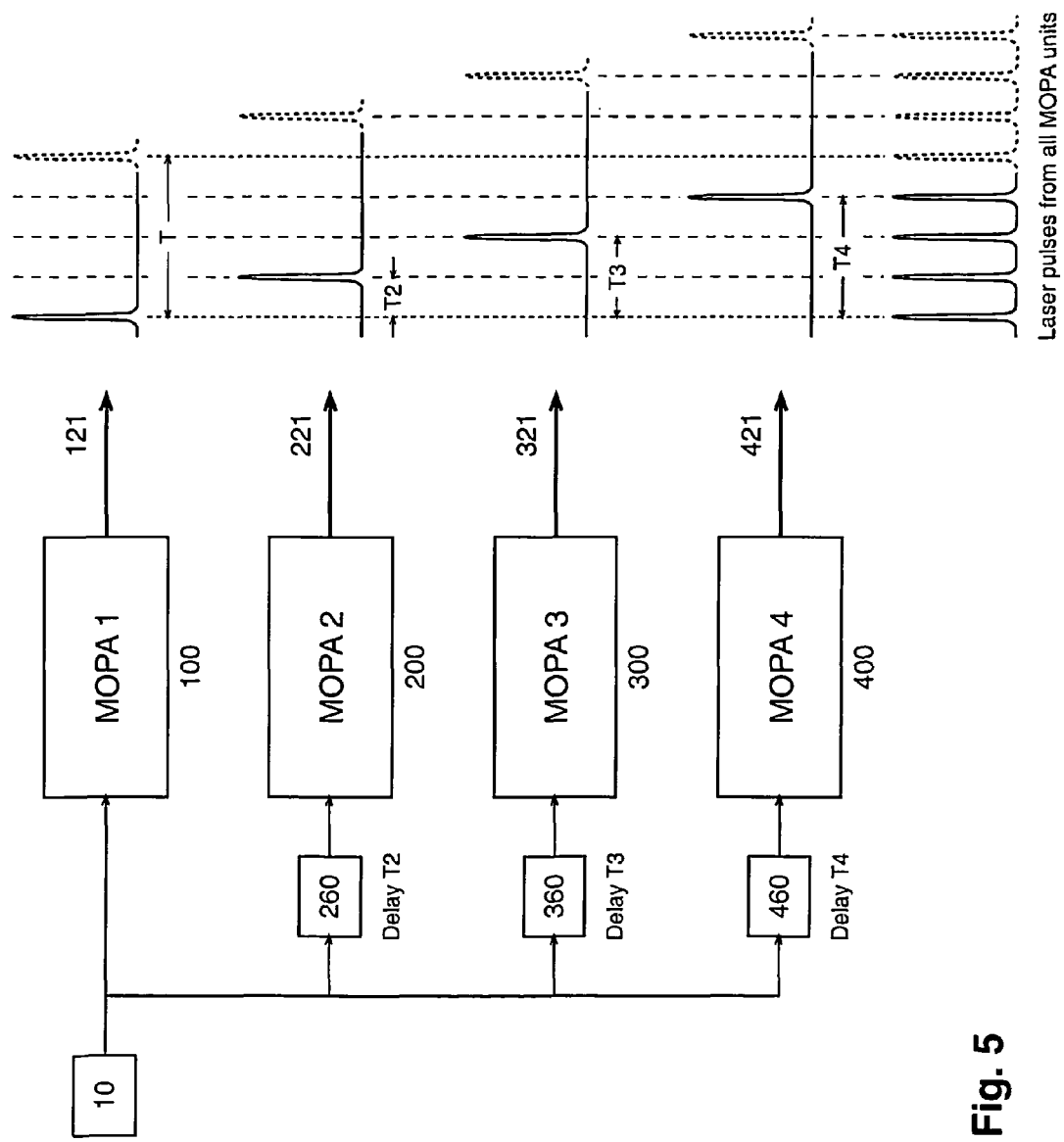
FIG. 5 illustrates the arrival times of the pulses from the different MOPA units with the relative delays between them of T2, T3, and T4, each of which is a fraction of the interval T between successive pulses from a MOPA unit.

In a like manner, as illustrated in FIG. 1, the signal 350 goes through an electronic delay unit 360 which produces the pulse 310 that is delayed after pulse 110 by a time interval T3. Since pulse T3 triggers the high-voltage pulse generators 309 and 317, pulses in the output beam 321 of MOPA 300 are delayed from pulses in the output beam 121 of MOPA 100 by the same time interval T3. Similarly, the signal 450 goes through an electronic delay unit 460 which produces the pulse 410 that is delayed after pulse 110 by a time interval T4. Since pulse T4 triggers the high-voltage pulse generators 409 and 417, pulses in the output beam 421 of MOPA 400 are delayed from pulses in the output beam 121 of MOPA 100 by the same time interval T4. The output beams 121, 221, 321, and 421 from MOPA units 100, 200, 300, and 400, respectively, and their relative arrival times and delays are further illustrated in FIG. 5. Note that each of the delays T2, T3, and T4 is a fraction of the interval T between successive pulses of a MOPA, and T4>T3>T2.

Figure 6:
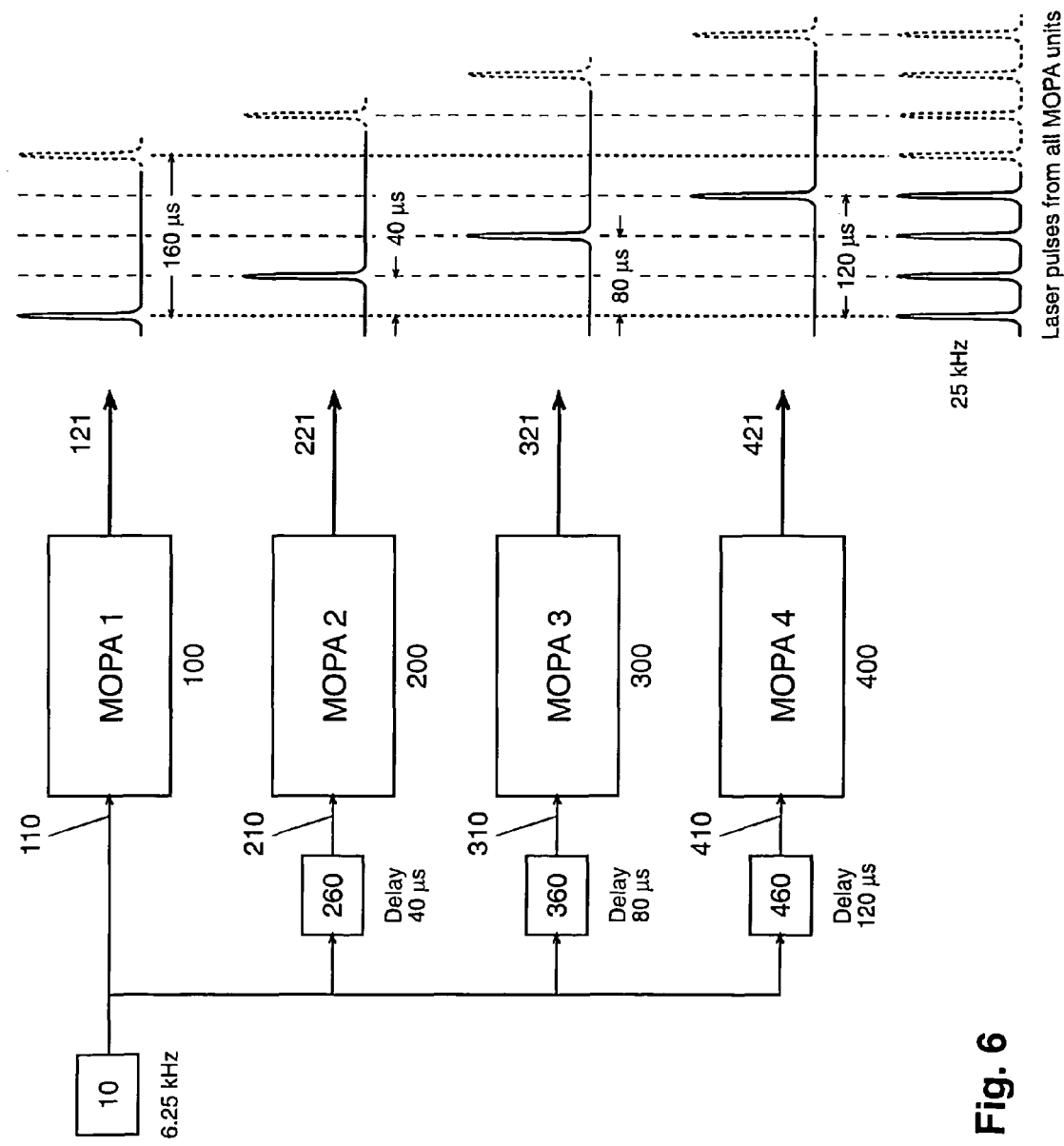
FIG. 6 illustrates the arrival times of the pulses from four different MOPA units, each of which has an interval 160 μs between successive pulses, with the relative delays between them of 40, 80, and 120 μs, which are one-fourth, half, and three-fourths of the interval between successive pulses from a single MOPA unit.

As an example, illustrated in FIG. 6, the pulse repetition rate of the pulse generator 10 may be 6.25 kHz, which provides an interval of 160 µs between successive pulses. Thus, pulses 110 arrive at the rate of 6.25 kHz and so do the output pulses 121 from MOPA 100 which therefore also have an interval of 160 µs between successive pulses. For this example, the delay intervals T2, T3, and T4 may be 40, 80, and 120 µs, respectively. Therefore, the trigger pulses 210, 310, and 410, while having the same repetition rate of 6.25 kHz as trigger 110, arrive with delays of 40, 80, and 120 µs, respectively, after triggers 110. As a result, the laser pulses 221, 321, and 421 from MOPAs 200, 300, and 400 also arrive with delays of 40, 80, and 120 µs, respectively, after the laser pulses 121 from MOPA 100. Therefore, when the output laser pulses from all four MOPAs are considered in combination, they effectively provide a train of laser pulses that arrive every 40 µs. The combined system is therefore equivalent to a pulsed laser source that has a repetition rate of $1/40$ µs=25 kHz.

Figure 7:
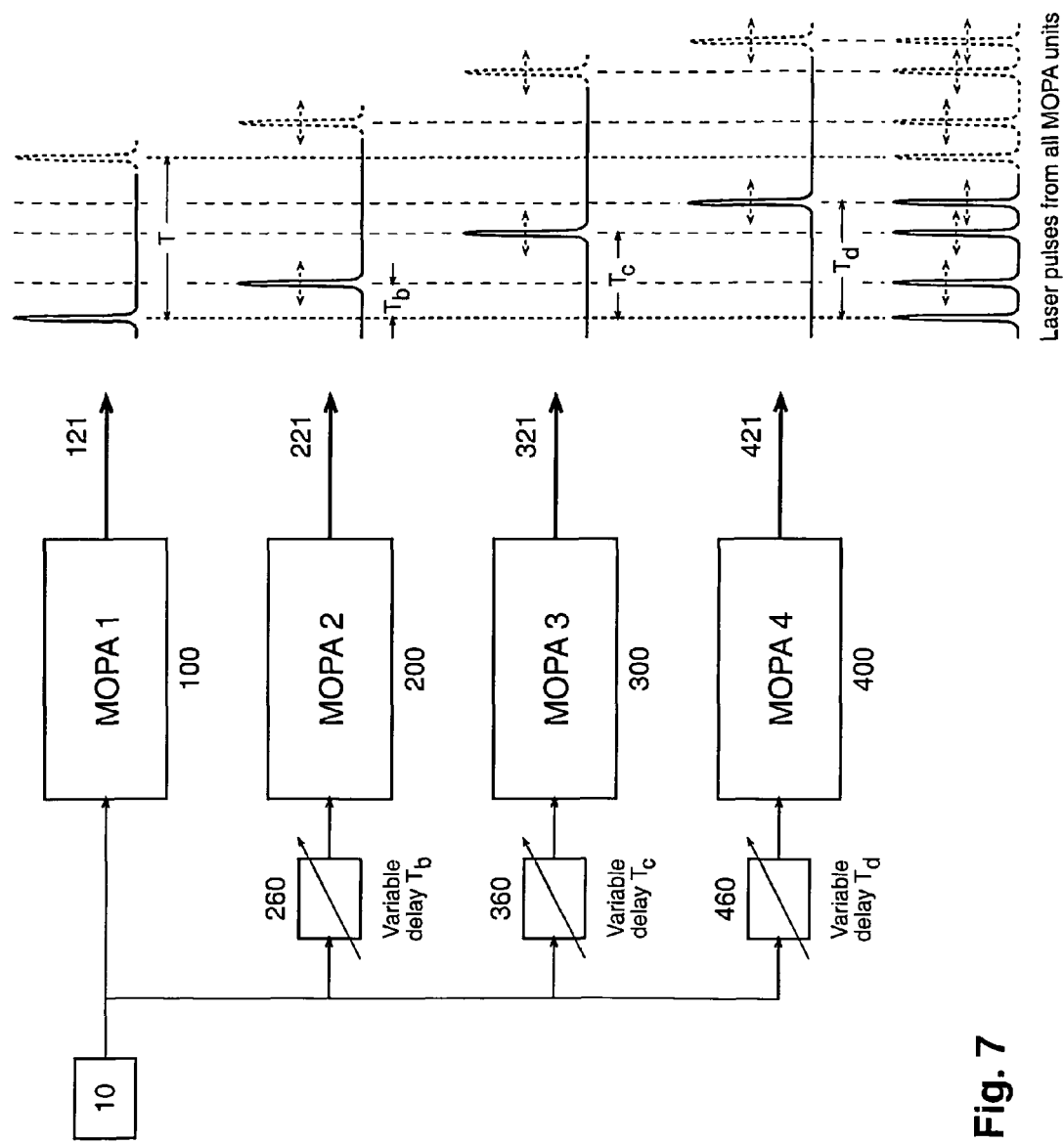
FIG. 7 illustrates an embodiment of the invention in which the arrival times of the pulses from the different MOPA units are made variable by making the relative delays between them of $T_b$, $T_c$, and $T_d$ variable.

The embodiment illustrated in FIG. 6 is a specific example in which the pulse repetition rate of the composite laser system (25 kHz) is a multiple (four in this case) of the pulse repetition rate of each of the individual laser units (6.25 kHz). Thus, the delays produced by electronic delay units 260, 360, and 460 (40, 80, and 120 µs, respectively) cause the pulses of the combined MOPA units to be equally spaced with a time interval of 40 µs between successive pulses. Note that in the illustration of FIG. 5, the delays produced by electronic delay units 260, 360, and 460 have been denoted as generalized quantities T2, T3, and T4, respectively. In a different embodiment, the delays T2, T3, and T4 can be made variable, which will enable MOPA units 200, 300, and 400 to emit their laser pulses at any desired time instants. Such an embodiment is illustrated in FIG. 7, in which the variable delays for the arrival times of the pulses from MOPA units 200, 300, and 400 with respect to the arrival times of the pulses from MOPA unit 100 are denoted as $T_b$, $T_c$, and $T_d$, respectively. Note that $T_b < T_c < T_d < T$.

Figure 8:
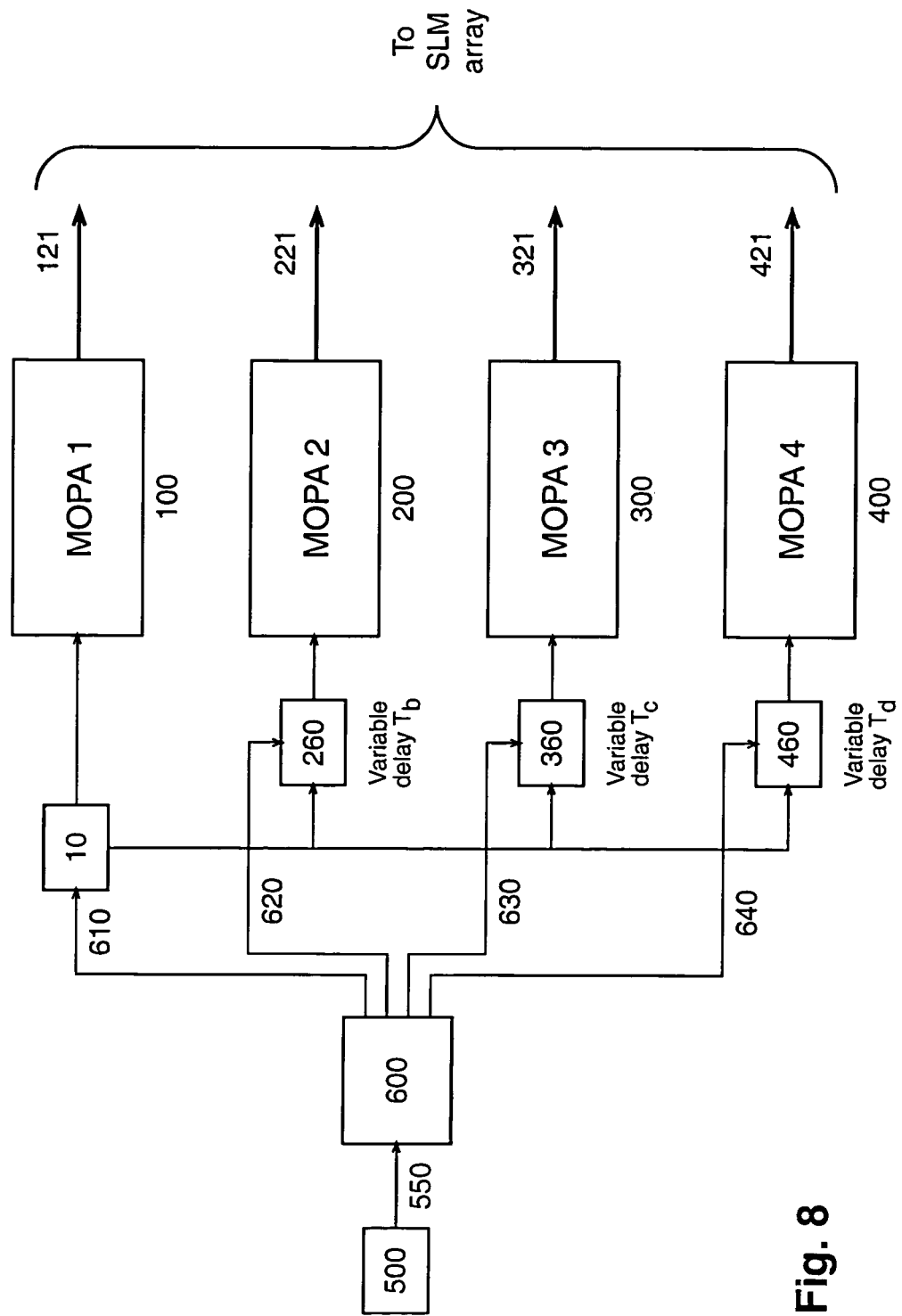
FIG. 8 shows an embodiment of the invention in which the arrival times of the pulses from the different MOPA units are dynamically optimized by utilizing information about the pattern to be exposed and the spatial light modulator elements to be illuminated.

In another embodiment, the timings of all the laser pulses are controlled dynamically by signals that are related to the pattern locations on the semiconductor wafer that are intended to be exposed by the laser pulses. More specifically, as illustrated in FIG. 8, the pattern information 550, which is in the form of a bit map stored in a data file 500, is converted by a control computer 600 into timing signals 610, 620, 630, and 640 using a suitable algorithm. These timing signals are sent to the pulse generator 10 and the variable delay units 260, 360, and 460. The result is that the laser pulses 121, 221, 321, and 421 from MOPA units 100, 200, 300, and 400, respectively, arrive at the spatial light modulator array which directs them to the semiconductor wafer at timing instants that are determined for optimized exposure of the desired pattern.

Figure 9:
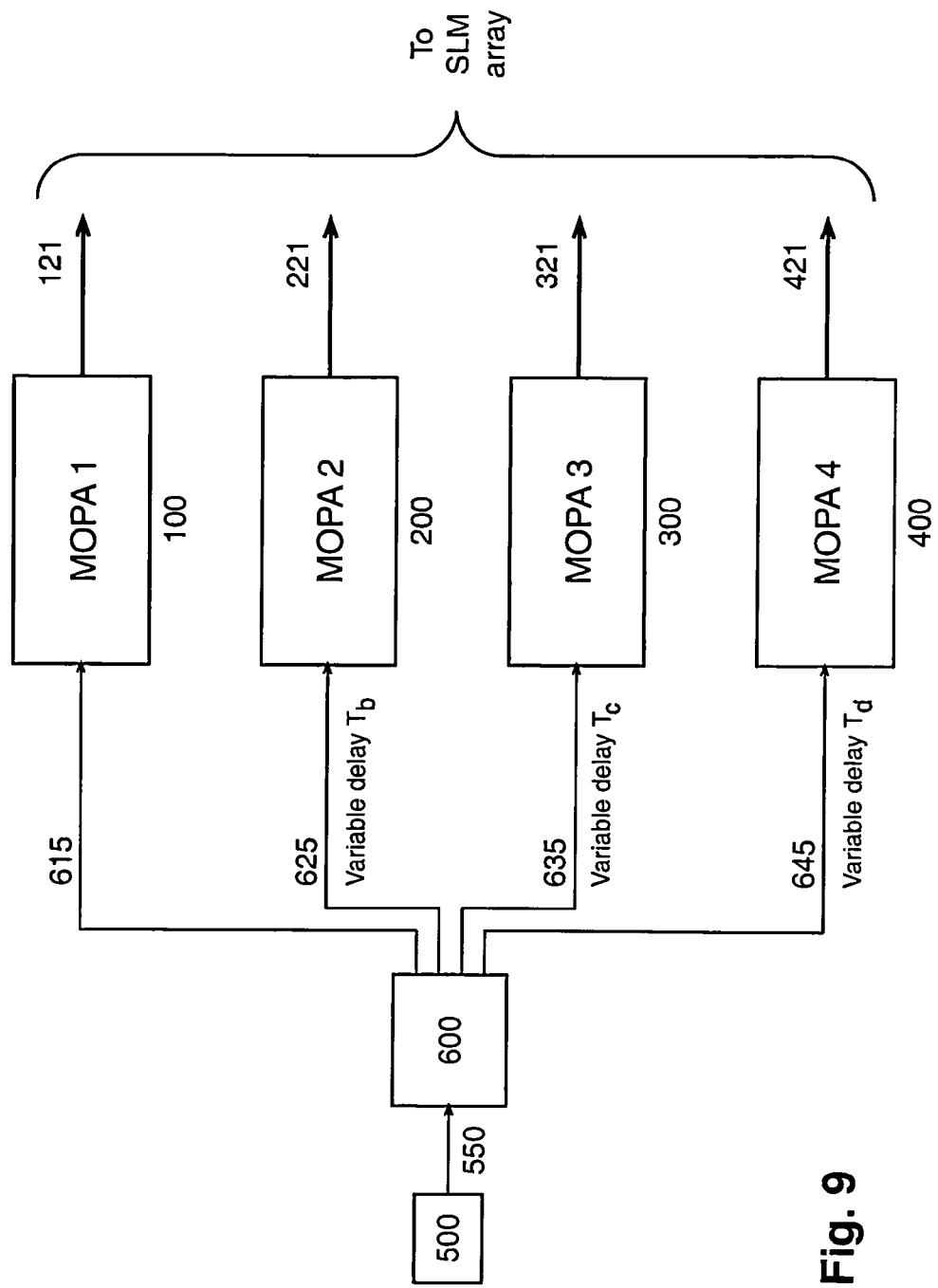
FIG. 9 illustrates an embodiment of the invention in which the arrival times of the pulses from the different MOPA units are made variable by making the relative delays between them of $T_b$, $T_c$, and $T_d$ variable directly by signals from a computer.

In another embodiment, shown in FIG. 9, the control computer 600 may provide the desired trigger signals directly (i.e., without the need for separate delay units 260, 360, and 460) with the proper time delays between them. These trigger signals 615, 625, 635, and 645, may be sent to the MOPA units 100, 200, 300, and 400, respectively, to trigger their firing which results in output pulses 121, 221, 321, and 421.

Figure 10:
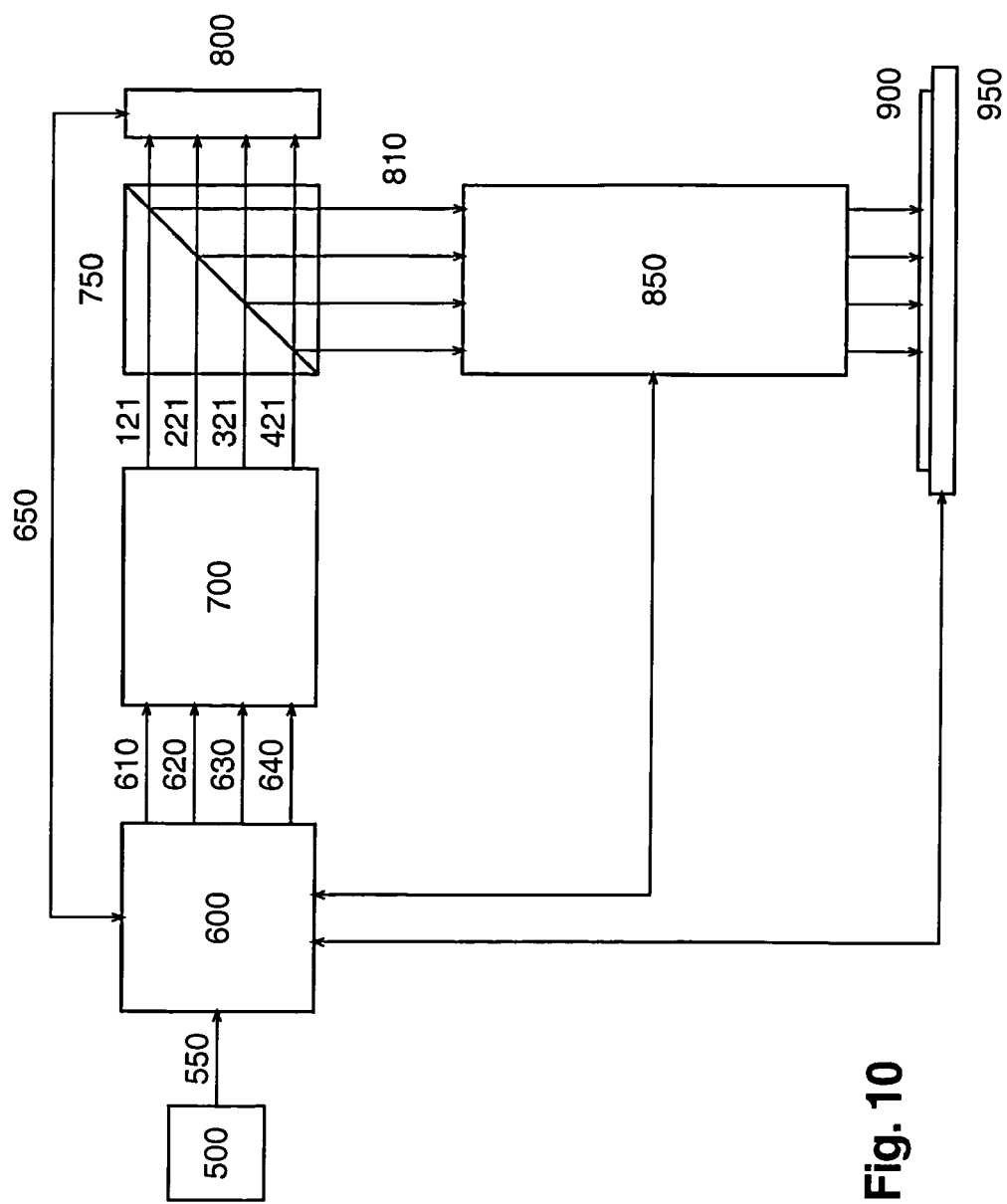
FIG. 10 illustrates a maskless lithography system comprising a high-repetition-rate laser source, a spatial light modulator array, a projection lens, other optical components, a scanning stage, and control computer that utilizes detailed pattern information to optimize and interactively control all subsystems.

An embodiment illustrating the implementation of the high-repetition-rate laser source in a maskless lithography system is shown in FIG. 10. The high-repetition-rate laser source, as discussed with reference to FIGS. 4-9, is denotes as 700 in FIG. 10. As described in the preceding paragraph, the pattern information 550 is sent from data file 500 to control computer 600, which converts the bit-map-format pattern information into timing signals 610, 620, 630, and 640, which are sent to the provides high-repetition-rate laser source 700, which provides laser pulses 121, 221, 321, and 421, which are sent to the spatial light modulator array 800 through illumination optics 750. The SLM, receiving signals 650 from control computer 600, directs light rays 810 into projection lens 850, which directs them onto semiconductor wafer 900 mounted on scanning stage 950. The control computer 600, in addition to processing the pattern information for providing signals to laser source 700 and SLM array 800, also optimally controls projection lens 850 and scanning stage 950 for their desired operation.

The above embodiments are just a few examples to illustrate the disclosed invention. Numerous other variations that fall within the scope of the invention are possible and will be evident to those skilled in arts of semiconductor manufacturing, lithography, signal processing, and related fields.

I claim:

1. The method of generating pulses of laser radiation at high repetition rates, comprising the steps of:
    (a) providing two or more laser units, each capable of producing pulses of laser radiation at a repetition rate of F (pulses per second), and capable of being triggered by external low-voltage pulse triggers;
    (b) providing an electronic pulse generator unit, capable of producing low-voltage trigger pulses that have a repetition rate of 2×F or greater, and that are capable of triggering said laser units of step (a);
    (c) triggering one of said laser units of step (a) by one sub-set of trigger pulses produced by said pulse generator of step (b); triggering another of said laser units of step (a) by another sub-set of trigger pulses produced by said pulse generator of step (b); and triggering other laser units of step (a) by other sub-sets of trigger pulses produced by said pulse generator of step (b);
    (d) providing a timing data file having the timing instants at which all the laser pulses from all the said laser units of step (a) are to be emitted; and
    (e) using the timing data file of step (d) to control the timings of the generation of the different sub-sets of trigger pulses produced by said pulse generator of step (b), such that
    said different laser units of step (a) are triggered by said sub-sets of trigger pulses produced by said pulse generator of step (b) at specified time instants, such that
    the repetition rate of the aggregate train of laser pulses from all said laser units of step (a) is greater than said repetition rate of F of a single laser unit, and the laser pulses in said aggregate train of laser pulses are emitted at specified time instants.

2. The method of generating pulses of laser radiation at high repetition rates according to claim 1, further comprising the steps of:
    (d.1) providing control means; and
    (e) using the timing data file of step (d) and said control means of step (d.1) to control the timings of the generation of the trigger pulses of the different sub-sets of trigger pulses produced by said pulse generator of step (b), such that
    said different laser units of step (a) are triggered by said sub-sets of trigger pulses produced by said pulse generator of step (b) at specified time instants, such that
    the repetition rate of the aggregate train of laser pulses from all said laser units of step (a) is greater than said repetition rate of F of a single laser unit, and the laser pulses in said aggregate train of laser pulses are emitted at specified time instants.

3. The method of generating pulses of laser radiation at high repetition rates according to claim 1, wherein:
    the trigger pulses of each of said sub-sets of trigger pulses are produced at a regular interval of T (seconds) with a pulse repetition rate of F (pulses per second) providing T=1/F.

4. The method of generating pulses of laser radiation at high repetition rates according to claim 3, wherein:
    the trigger pulses of the second sub-set of trigger pulses are produced after a delay of T2 (seconds) after the trigger pulses of the first sub-set of trigger pulses wherein T2 is less than T and the ratio T/T2 is an integer equal to two or greater;
    the trigger pulses of the third sub-set of trigger pulses are produced after a delay of T3 (seconds) after the trigger pulses of the first sub-set of trigger pulses wherein T3 is less than T and T3=2×T2; and so on for all other sub-sets of trigger pulses such that:
    the trigger pulses of the $n^{th}$ sub-set of trigger pulses are produced after a delay of Tn (seconds) after the trigger pulses of the first sub-set of trigger pulses wherein Tn is less than T and Tn=(n−1)×T2 is an integer equal to two or greater.

5. The method of generating pulses of laser radiation at high repetition rates according to claim 1, wherein each of said laser units is an excimer laser.

6. The method of generating pulses of laser radiation at high repetition rates according to claim 1, wherein each of said laser units is an Argon Fluoride excimer laser operating at a wavelength of 193 nanometers.

7. The method of generating pulses of laser radiation at high repetition rates according to claim 1, wherein each of said laser units is a Krypton Fluoride excimer laser operating at a wavelength of 248 nanometers.

8. The method of generating pulses of laser radiation at high repetition rates according to claim 1, wherein each of said laser units is an excimer laser system comprising a master-oscillator sub-unit and a power-amplifier sub-unit.

9. The method of generating pulses of laser radiation at high repetition rates according to claim 5, wherein the pulse repetition frequency F of each of said excimer laser units is in the range of 1,000-10,000 pulses per second.

10. The method of generating pulses of laser radiation at high repetition rates according to claim 8, wherein said master-oscillator sub-units and power-amplifier sub-units are paired and are in the range of 2-8 pairs.

11. The method of generating pulses of laser radiation at high repetition rates according to claim 4, wherein each of said delays T2, T3, . . . , Tn of said second, third, . . . , $n^{th}$ sub-sets of trigger pulses is in the range of 10-100 microseconds.

12. The method of generating pulses of laser radiation at high repetition rates according to claim 1, wherein the repetition rate of the aggregate train of laser pulses from all said laser units is in the range of 5,000-100,000 pulses per second.

13. A laser radiation emission system capable of generating pulses of laser radiation at high repetition rates, comprising:
    (a) at least two laser units, each capable of producing pulses of laser radiation at a repetition rate of F (pulses per second), and capable of being triggered by external low-voltage pulse triggers; and
    (b) an electronic pulse generator unit, capable of producing low-voltage trigger pulses that have a repetition rate of 2×F or greater, and that are capable of triggering said laser units of (a); wherein:
    (c) one of said laser units of (a) is triggered by one sub-set of trigger pulses produced by said pulse generator of (b); another of said laser units of (a) is triggered by another sub-set of trigger pulses produced by said pulse generator of (b); and other laser units of (a) are triggered by other sub-sets of trigger pulses produced by said pulse generator of (b);
    and further comprising:
    (d) a timing data file having the timing instants at which all the laser pulses from all the said laser units of (a) are to be emitted; wherein:

the timing data file of (d) is used to control the timings of the generation of the different sub-sets of trigger pulses produced by said pulse generator of (b), such that said different laser units of (a) are triggered by said sub-sets of trigger pulses produced by said pulse generator of step (b) at specified time instants, such that the repetition rate of the aggregate train of laser pulses from all said laser units of (a) is greater than said repetition rate of F of a single laser unit, and the laser pulses in said aggregate train of laser pulses are emitted at specified time instants.

14. A laser radiation emission system capable of generating pulses of laser radiation at high repetition rates according to claim 13, further comprising:

(d.1) control means; wherein:

the timing data file of (d) is used by said control means of (d.1) to control the timings of the generation of the trigger pulses of the different sub-sets of trigger pulses produced by said pulse generator of (b), such that said different laser units of (a) are triggered by said sub-sets of trigger pulses produced by said pulse generator of (b) at specified time instants, such that the repetition rate of the aggregate train of laser pulses from all said laser units of (a) is greater than said repetition rate of F of a single laser unit, and the laser pulses in said aggregate train of laser pulses are emitted at specified time instants.

15. A laser radiation emission system capable of generating pulses of laser radiation at high repetition rates according to claim 13, wherein:

the trigger pulses of each of said sub-sets of trigger pulses are produced at a regular interval of T (seconds) with a pulse repetition rate of F (pulses per second) providing $T=1/F$.

16. A laser radiation emission system capable of generating pulses of laser radiation at high repetition rates according to claim 15, wherein:

the trigger pulses of the second sub-set of trigger pulses are produced after a delay of T2 (seconds) after the trigger pulses of the first sub-set of trigger pulses wherein T2 is less than T and the ratio T/T2 is an integer equal to two or greater;

the trigger pulses of the third sub-set of trigger pulses are produced after a delay of T3 (seconds) after the trigger pulses of the first sub-set of trigger pulses wherein T3 is less than T and T3=2×T2; and so on for all other sub-sets of trigger pulses such that:

the trigger pulses of the $n^{th}$ sub-set of trigger pulses are produced after a delay of Tn (seconds) after the trigger pulses of the first sub-set of trigger pulses wherein Tn is less than T and Tn=(n−1)×T2 is an integer equal to two or greater.

17. A laser radiation emission system capable of generating pulses of laser radiation at high repetition rates according to claim 13, wherein each of said laser units is an excimer laser.

18. A laser radiation emission system capable of generating pulses of laser radiation at high repetition rates according to claim 13, wherein each of said laser units is an excimer laser system comprising a master-oscillator sub-unit and a power-amplifier sub-unit.

\* \* \* \* \*